(12) United States Patent
Bohl

(10) Patent No.: US 8,581,088 B2
(45) Date of Patent: Nov. 12, 2013

(54) THERMOELECTRIC POWER GENERATION APPARATUS AND METHOD

(76) Inventor: Jeffery J. Bohl, Glendale, AZ (US)

(*) Notice: Subject to any disclaimer, the term of this patent is extended or adjusted under 35 U.S.C. 154(b) by 16 days.

(21) Appl. No.: 13/310,726

(22) Filed: Dec. 3, 2011

(65) Prior Publication Data

US 2012/0073620 A1 Mar. 29, 2012

(51) Int. Cl.
*H01L 35/32* (2006.01)

(52) U.S. Cl.
USPC ........... 136/224; 136/200; 136/205; 136/206; 136/207; 136/208; 136/209; 136/210; 136/211; 136/212

(58) Field of Classification Search
USPC .................................. 136/200, 205–212, 224
See application file for complete search history.

(56) References Cited

U.S. PATENT DOCUMENTS

| | | | |
|---|---|---|---|
| 5,987,891 A | 11/1999 | Kim et al. | |
| 6,216,480 B1 | 4/2001 | Camus et al. | |
| 6,662,572 B1 | 12/2003 | Howard | |
| 7,621,136 B2 | 11/2009 | Kim | |
| 7,762,601 B2 | 7/2010 | Shea et al. | |
| 7,836,705 B2 | 11/2010 | Teschner et al. | |
| 7,866,164 B2 | 1/2011 | Rice | |
| 7,932,459 B2 | 4/2011 | Kondoh | |
| 2006/0156738 A1 | 7/2006 | Khalil | |
| 2008/0023057 A1 | 1/2008 | Nakajima et al. | |
| 2009/0038667 A1* | 2/2009 | Hirono et al. | 136/205 |
| 2010/0101621 A1* | 4/2010 | Xu | 136/206 |
| 2010/0236595 A1* | 9/2010 | Bell et al. | 136/205 |

* cited by examiner

*Primary Examiner* — Jennifer Michener
*Assistant Examiner* — Matthew Martin
(74) *Attorney, Agent, or Firm* — Thomas W. Galvani, P.C.; Thomas W. Galvani

(57) ABSTRACT

A thermoelectric power generation apparatus includes a thermoelectric device having a first surface, an opposed second surface, and a first thermal energy storage unit operatively coupled to the first surface of the thermoelectric device setting the first surface at a first temperature. The thermoelectric power generation apparatus also includes a second thermal energy storage unit having a second temperature, the second thermal energy unit for setting the second surface of the thermoelectric device at an operative temperature in response to a temperature difference between the first temperature of the first surface and the second temperature of the second thermal energy storage unit. The thermoelectric device generates power in response to a temperature differential between the first temperature of the first surface and the operative temperature of the second surface.

19 Claims, 7 Drawing Sheets

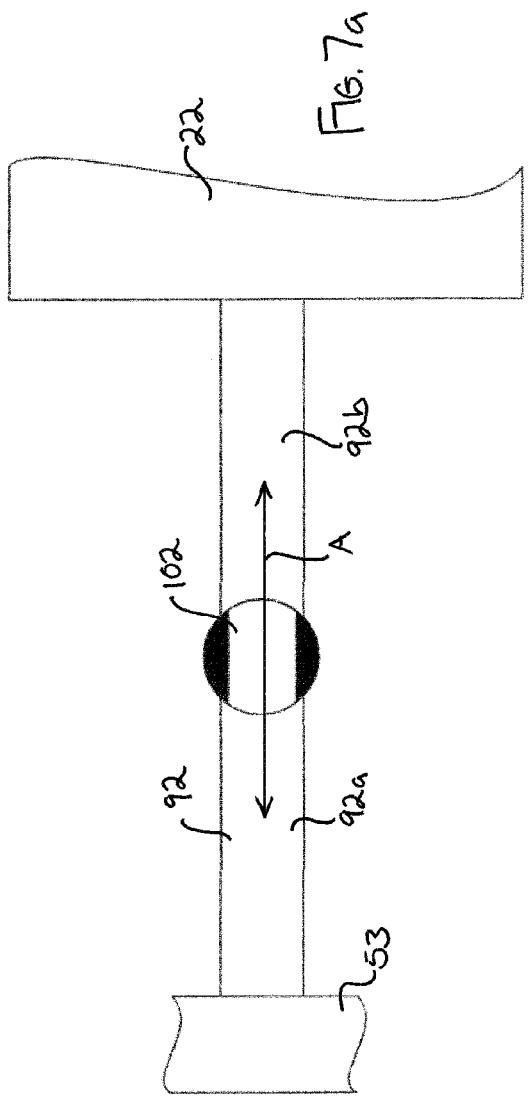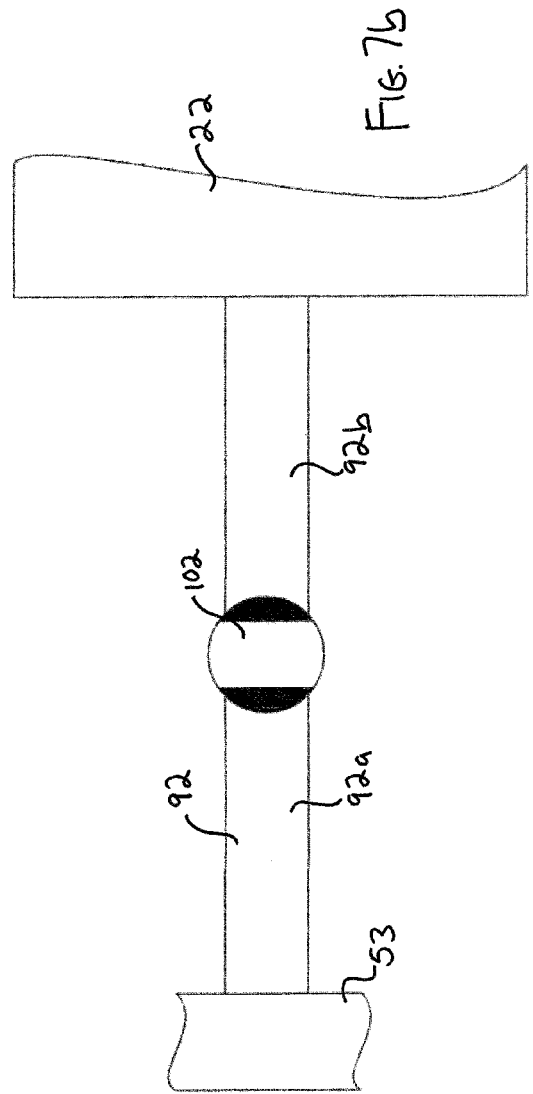

THERMOELECTRIC POWER GENERATION APPARATUS AND METHOD

FIELD OF THE INVENTION

The present invention relates to systems and methods for generating electricity and, more specifically, to thermoelectric apparatuses for generating electricity.

BACKGROUND OF THE INVENTION

Electricity is a necessity of modern life. It operates our factories, our buildings, our homes, and the appliances within them, and without it, human society would come to a halt. Although electricity is a vital form of energy, a large amount of it is wasted. Some is wasted actively, such as by lights left on after a person leaves the room or by an air conditioning system still operating while a person is away from home. Some is wasted passively by the failure to capture energy that is readily available for human conversion into power.

The sun radiates electromagnetic and thermal energy against the Earth continually, lighting and heating buildings, roads, sidewalks, pools, roofs, walls, and all manner of things in the world. These objects absorb thermal energy and later release it back into the environment. Heat that is not permanently absorbed, captured, or converted is lost. Efforts have been made to capture the thermal energy released by the sun, but the results have been less than satisfactory, either because of expense, maintenance, or inefficiency. Accordingly, there is a need for an improved system and method for capturing heat and converting it into energy.

One manner in which heat can be captured is through the conversion of a thermal energy gradient into electrical power. The thermoelectric effect is the transformation of a temperature or thermal energy difference into an electrical potential. This principle relies on the tendency of charged carriers to move from hot to cold. The Seebeck effect is the specific principle that a temperature difference will generate a voltage in a conductor.

Thermoelectric devices exploit the Seebeck effect. A thermoelectric device is typically a thin electrical assembly having a hot side, an opposed cold side, semiconducting materials spaced between the hot and cold sides, and leads extending from the device at which a voltage difference is established in response to the differences in temperature between the hot and cold sides. Thermoelectric devices are non mechanical, efficient, and reliable means of producing electricity from thermal energy, and there is a great need for power generated from renewable sources such as the heat radiated from the sun.

SUMMARY OF THE INVENTION

According to the principle of the invention, a thermoelectric power generation apparatus includes a thermoelectric device having a first surface and an opposed second surface, and a first thermal energy storage unit operatively coupled to the first surface of the thermoelectric device setting the first surface at a first temperature. A second thermal energy storage unit has a second temperature and is for setting the second surface of the thermoelectric device at an operative temperature in response to a temperature difference between the first temperature of the first surface and the second temperature of the second thermal energy storage unit. The thermoelectric device generates power in response to a temperature differential between the first temperature of the first surface and the operative temperature of the second surface. The second thermal energy storage unit includes a first thermal mass located apart from the thermoelectric device. The second thermal energy storage unit is adjustable between a coupled arrangement and a decoupled arrangement. In the coupled arrangement of the second thermal energy storage unit, the first thermal mass is coupled in thermal communication to the second surface of the thermoelectric device, allowing thermal energy transfer between the first thermal mass and the second surface of the thermoelectric device, while in the decoupled arrangement of the second thermal energy storage unit, the first thermal mass is decoupled from thermal communication to the second surface of the thermoelectric device, preventing thermal energy transfer between the first thermal mass and the second surface of the thermoelectric device. The invention also includes a controller for sensing the first temperature of the first surface and the second temperature of the second thermal energy storage unit. The controller instructs the second thermal energy storage unit to move between the coupled and decoupled arrangements in response to the temperature difference between the first temperature and the second temperature so as to set the second surface of the thermoelectric device at the operative temperature. The second thermal energy storage unit includes a second thermal mass located apart from the thermoelectric device. The second thermal mass is adjustable between a coupled arrangement and a decoupled arrangement. In the coupled arrangement of the second thermal mass and in the coupled arrangement of the second thermal energy storage unit, the second thermal mass is coupled in thermal communication to the second surface of the thermoelectric device, allowing thermal energy transfer between the second thermal mass and the second surface of the thermoelectric device, while in the decoupled arrangement of the second thermal mass, the second thermal mass is decoupled from thermal communication to the second surface of the thermoelectric device, preventing thermal energy transfer between the second thermal mass and the second surface of the thermoelectric device. The first and second thermal masses have first and second coefficients of thermal conductivity, and the first and second thermal masses are located in an environment which has a third coefficient of thermal conductivity. Each of the first and second coefficients of thermal conductivity are greater than the third coefficient of thermal conductivity of the environment in which the first and second thermal masses are located. The first thermal mass is installed in the ground at a first depth below the surface of the ground, the second thermal mass is installed in the ground at a second depth below the surface of the ground, and the first depth is different from the second depth.

According to the principle of the invention, a thermoelectric power generation apparatus includes a thermoelectric device having a first surface with a first temperature and an opposed second surface with a second temperature. The thermoelectric device is for generating power in response to a difference between the first temperature and the second temperature. A first thermal energy storage unit is coupled to the first surface of the thermoelectric device providing the first temperature of the first surface. A second thermal energy storage unit has a third temperature. The second thermal energy storage unit is operatively coupled in thermal communication to the second surface of the thermoelectric device so as to change the second temperature of the second surface to an operative temperature in response to a temperature difference between the first temperature of the first surface and the third temperature of the second thermal energy storage unit. The thermoelectric device generates power in response to a temperature differential between the first temperature of the first surface and the operative temperature of the second surface. The second thermal energy storage unit comprises a first thermally-conductive thermal mass located apart from the thermoelectric device. A first thermally-conductive connection extends between the first thermal mass and the second surface of the thermoelectric device, and a first switch is formed in the first connection between the first thermal mass and the second surface of the thermoelectric device. The first switch is moveable between an open position and a closed position. In the open position of the first switch, the first thermal mass is decoupled from thermal communication to the second surface of the thermoelectric device preventing thermal energy transfer between the first thermal mass and the second surface of the thermoelectric device, while in the closed position of the first switch, the first thermal mass is coupled in thermal communication to the second surface of the thermoelectric device, allowing thermal energy transfer between the first thermal mass and the second surface of the thermoelectric device. The invention further includes a housing bounding an interior and having a top. The first thermal energy storage unit is a thermally-conductive plate mounted to the housing proximate to the top of the housing, which plate has opposed upper and lower surfaces. The thermoelectric device is in the interior of the housing, and the first surface of the thermoelectric device is applied against the lower surface of the plate. The first thermal mass is located outside of the housing. The second thermal energy storage unit includes a second thermally-conductive thermal mass located outside of the housing, a second thermally-conductive connection extending between the second thermal mass and the second surface of the thermoelectric device, and a second switch formed in the second connection between the second thermal mass and the second surface of the thermoelectric device. The second switch is moveable between an open position and a closed position. In the open position of the second switch, the second thermal mass is decoupled from thermal communication to the second surface of the thermoelectric device preventing thermal energy transfer between the second thermal mass and the second surface of the thermoelectric device, while in the closed position of the second switch, the second thermal mass is coupled in thermal communication to the second surface of the thermoelectric device, allowing thermal energy transfer between the second thermal mass and the second surface of the thermoelectric device. The first thermal mass has a fourth temperature, and the second thermal mass has a fifth temperature. The invention includes a controller for detecting the first, second, fourth, and fifth temperatures and for moving the first and second switches between the open and closed positions in response to differences among the first, second, fourth, and fifth temperatures so as to control thermal energy transfer between the first and second thermal masses and the second surface of the thermoelectric device to change the second temperature at the second surface of the thermoelectric device to the operative temperature. The first and second thermal masses have first and second coefficients of thermal conductivity, and the first and second connections have third and fourth coefficients of thermal conductivity, respectively. The first and second thermal masses and the first and second connections are located in an environment which has a fifth coefficient of thermal conductivity, and each of the first, second, third, and fourth coefficients of thermal conductivity are greater than the fifth coefficient of thermal conductivity of the environment in which the first and second thermal masses and the first and second connections are located. A lens is mounted proximate to the top of the housing, and the lens has a focal length. The upper surface of the plate mounted to the housing is separated from the lens by a distance corresponding to the focal length of the lens. The housing is installed in the ground so as to locate the top of the housing at the surface of the ground, the first thermal mass is installed at a first depth below the surface of the ground, the second thermal mass is installed at a second depth below the surface of the ground, and the first depth is different from the second depth.

According to the principle of the invention, a method for generating power includes providing a thermoelectric device having a first surface and an opposed second surface, the first surface having a first temperature and the second surface having a second temperature, and changing the second temperature of the second surface to an operative temperature different from the first and second temperatures forming a temperature differential between the first temperature of the first surface and the operative temperature of the second surface. The method next includes the thermoelectric device generating power in response to the temperature differential. The method further includes providing a thermally-conductive plate and thermally coupling the plate to the first surface of the thermoelectric device allowing thermal energy transfer between the plate and the first surface of the thermoelectric device. In an embodiment according to the principle of the invention, the step of changing the second temperature of the second surface to an operative temperatures includes providing a first thermal mass having a third temperature different from the first temperature of the first surface of the thermoelectric device and the second temperature of the second surface of the thermoelectric device, thermally coupling the first thermal mass to the second surface of the thermoelectric device, and transferring thermal energy between the first thermal mass and the second surface of the thermoelectric device. In the embodiment, the step of changing the second temperature of the second surface to an operative temperatures further includes providing a second thermal mass having a fourth temperature different from the first temperature of the first surface of the thermoelectric device and the second temperature of the second surface of the thermoelectric device, thermally coupling the second thermal mass to the second surface of the thermoelectric device, and transferring thermal energy between the second thermal mass and the second surface of the thermoelectric device. The method still further includes installing the first thermal mass at a first depth below the ground and installing the second thermal mass at a second depth below ground that is different from the first depth.

BRIEF DESCRIPTION OF THE DRAWINGS

Referring to the drawings:

FIG. 7a is a highly generalized diagrammatic representation of a switch formed in a branch between one of the heat sinks and the conduit of FIG. 1 illustrating the switch arranged in a closed position;

FIG. 7b is a highly generalized diagrammatic representation of the switch of FIG. 7a illustrating the switch arranged in an open position.

DETAILED DESCRIPTION

Figure 1:
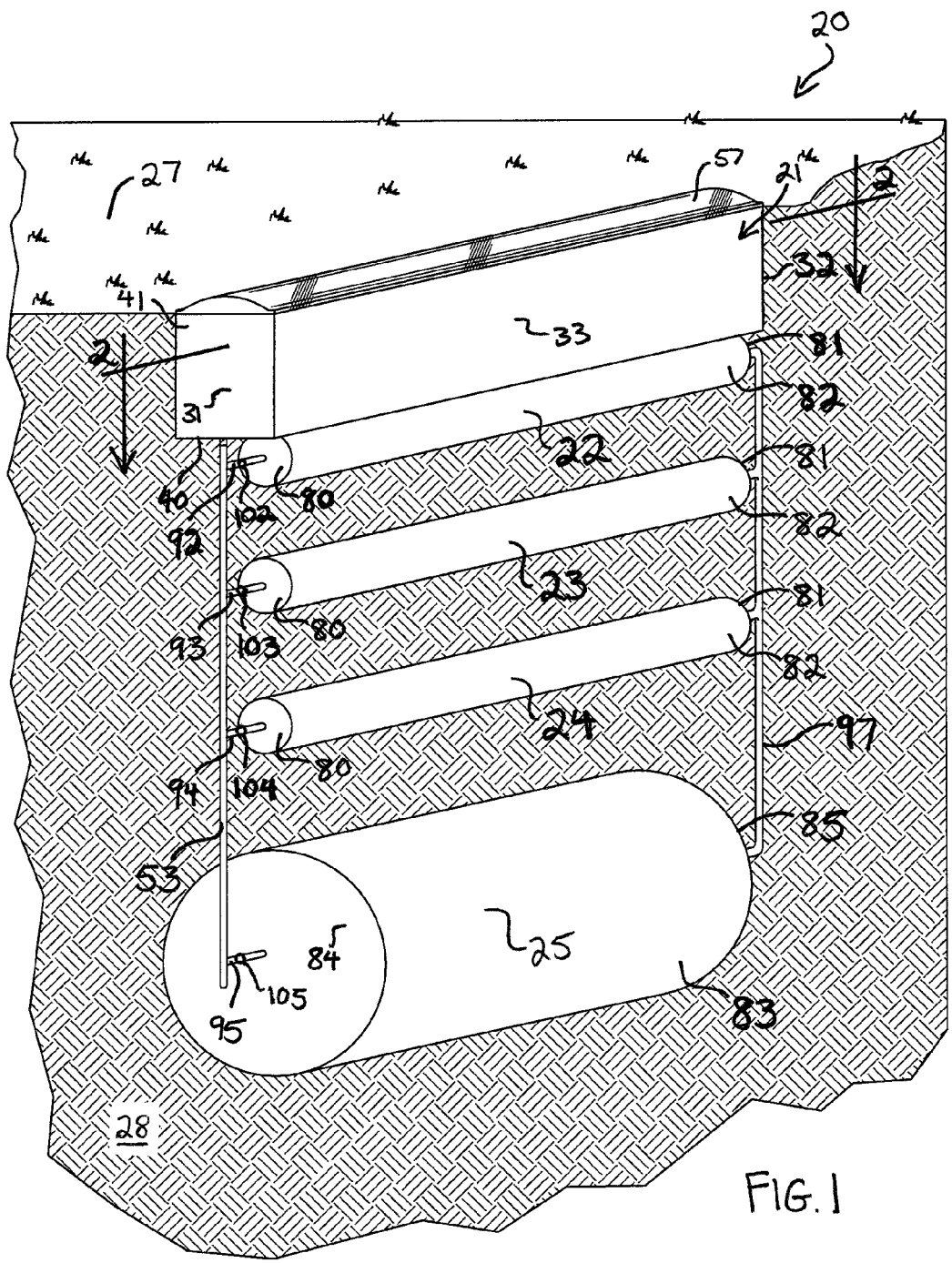
FIG. 1 is a perspective view of a thermoelectric power generation apparatus constructed and arranged according to the principle of the invention, the apparatus including a housing, a plurality of heat sinks below the housing, and a conduit extending between the heat sinks and the housing.

Turning now to the drawings, in which like reference characters indicate corresponding elements throughout the several views, attention is first directed to FIG. 1, illustrating a thermoelectric power generation apparatus 20. Thermoelectric power generation apparatus 20 includes a housing 21 buried at ground level 27 and heat sinks 22, 23, 24, and 25 buried below housing 21 in the ground 28. With continuing reference to FIG. 1, and reference to relevant parts of FIG. 2 and FIG. 3, thermoelectric power generation apparatus 20 further includes a plate 26 and a plurality of thermoelectric devices 30 within the housing 21. Plate 26 and heat sinks 22, 23, 24, and 25 cooperate to transfer thermal energy to and from thermoelectric devices 30 so that thermoelectric devices 30 generate power.

Figure 2:
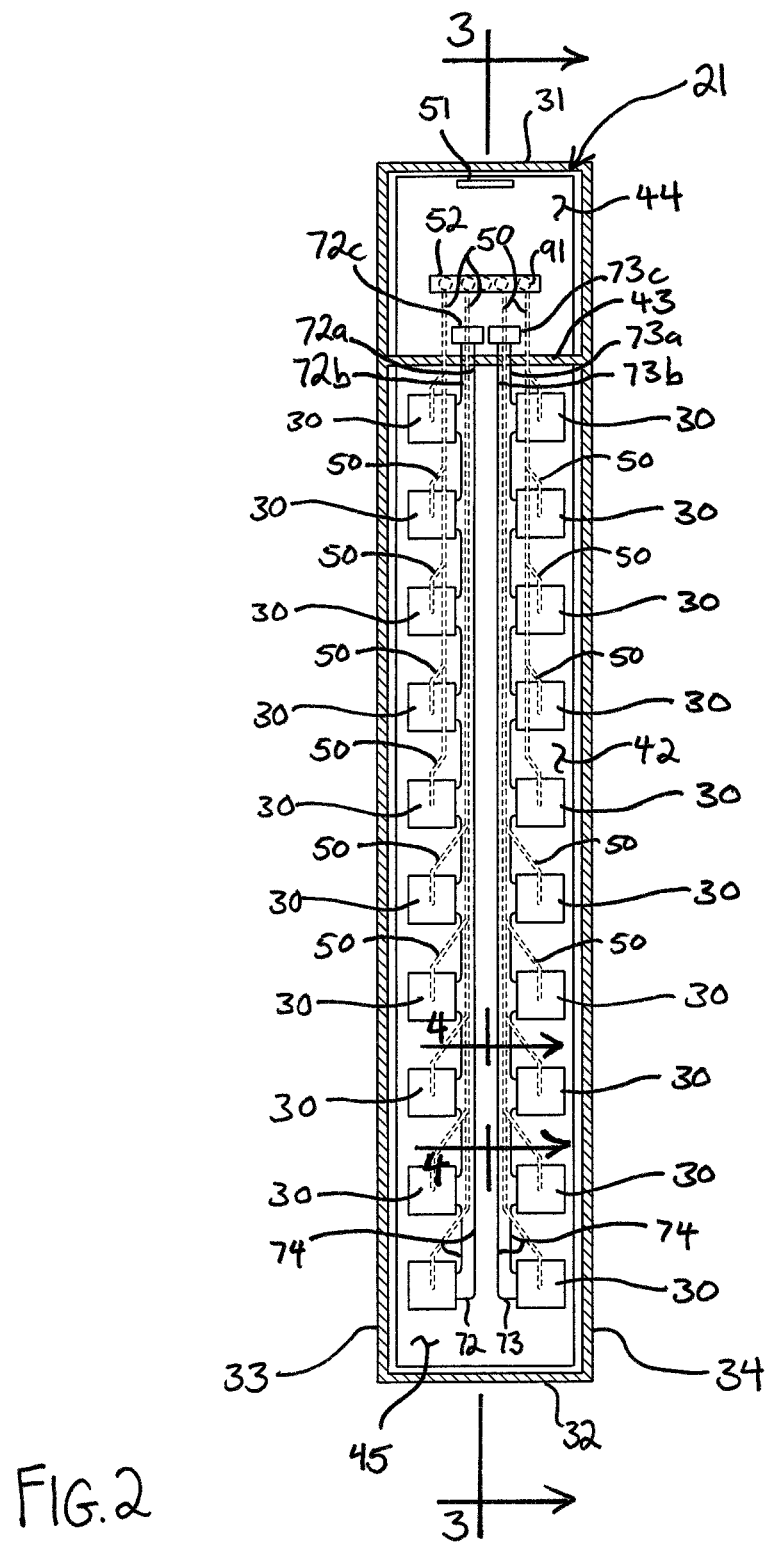
FIG. 2 is a section view taken along the line 2-2 of FIG. 1 illustrating the housing of FIG. 1 containing a manifold, a plurality of thermoelectric devices, wires coupling the thermoelectric devices with the manifold, and a circuit coupling the thermoelectric devices.
Figure 3:
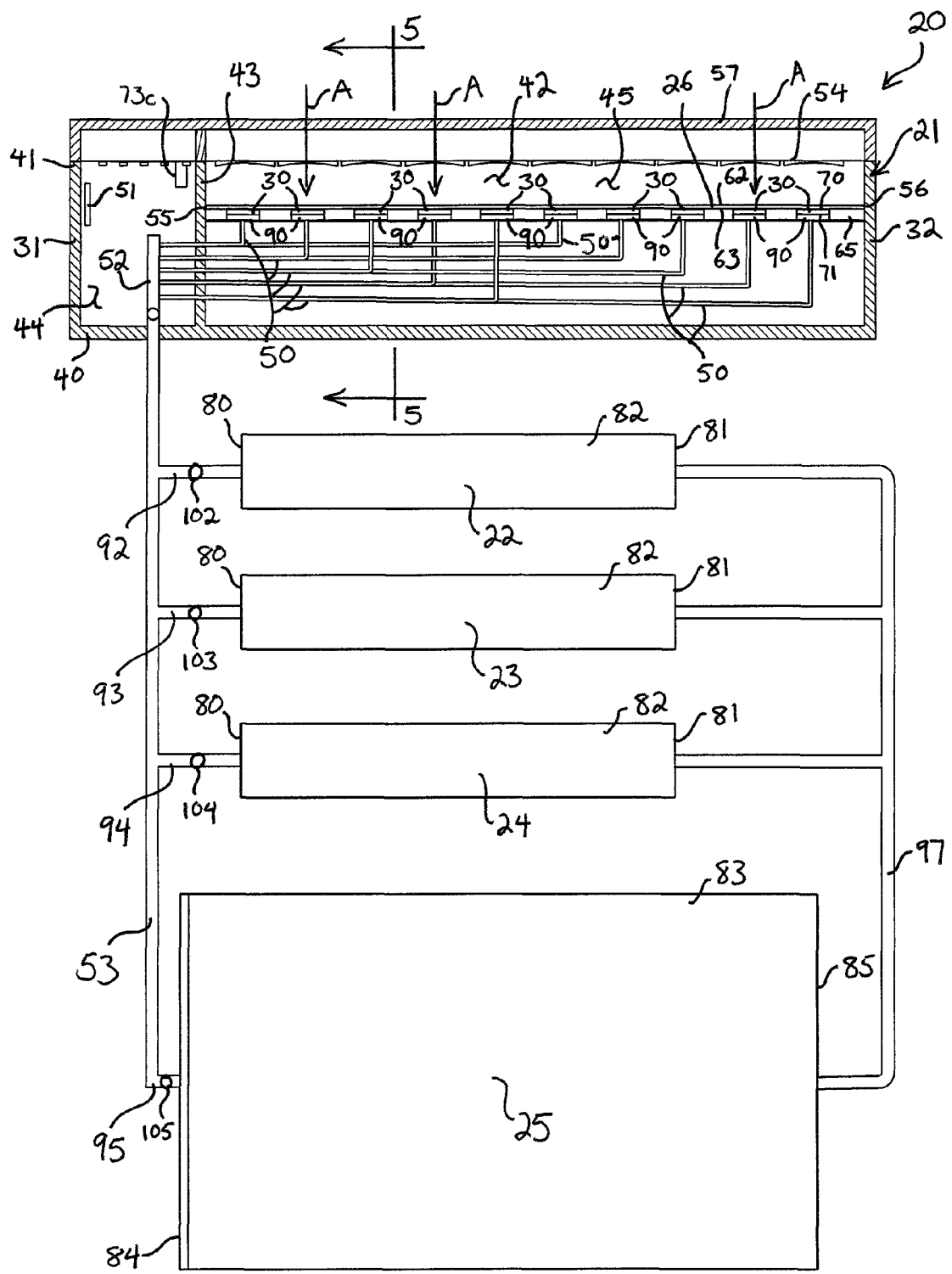
FIG. 3 is a section view taken along the line 3-3 of FIG. 2 illustrating the housing of FIG. 1 containing the thermoelectric devices and the wires coupling the thermoelectric devices to the manifold and the heat sinks.

With continuing reference to FIGS. 1-3, housing 21 is illustrated. Housing 21 has opposed parallel ends 31 and 32, opposed parallel sides 33 and 34 extending between ends 31 and 32 cooperating to form a sidewall, a bottom 40 extending between ends 31 and 32 from side 33 to side 34, and a top 41. Housing 21 is constructed of a material having strong, rigid, and rugged material properties, such as molded plastic, metal, or the like. With reference to FIG. 3, housing 21 encloses an interior 42 and is fluid impervious to prevent fluid transfer through housing 21 to and from interior 42. Interior 42 contains plate 26 and thermoelectric devices 30, as well as a plurality of wires 50 which converge into a thermal manifold 52. Manifold 52 is fixed at one end to a conduit 53 extending downwardly from housing 20 to heat sinks 22, 23, 24, and 25. In this way, thermoelectric devices 30 in interior 42 are coupled to heat sinks 22, 23, 24, and 25 outside interior 42 via transmission means or a connection comprising wires 50, manifold 52, and conduit 53, so that heat can travel from heat sinks 22, 23, 24, and 25 through conduit 53 into manifold 52 and from manifold 52 to wires 50 which are thermally coupled to thermoelectric devices 30. Interior 42 of housing 21 is divided by an inner wall 43 into a control compartment 44, which is a minor compartment of interior 42, and a thermal compartment 45, which is a major compartment of interior 42. Inner wall 43 extends from side 33 to side 34 and between bottom 40 and top 41, physically and thermally isolating control compartment 44 from thermal compartment 45. Thermal compartment 45 contains plate 26 and thermoelectric devices 30, as well as wires 50. Control compartment 44 contains a controller 51, such as a computer or programmable logic controller, for controlling heat transfer between heat sinks 22, 23, 24, and 25 and thermoelectric devices 30. Control compartment 44 also contains manifold 52 at which wires 50 converge into conduit 53 extending downwardly from housing 20 to heat sinks 22, 23, 24, and 25.

Figure 5:
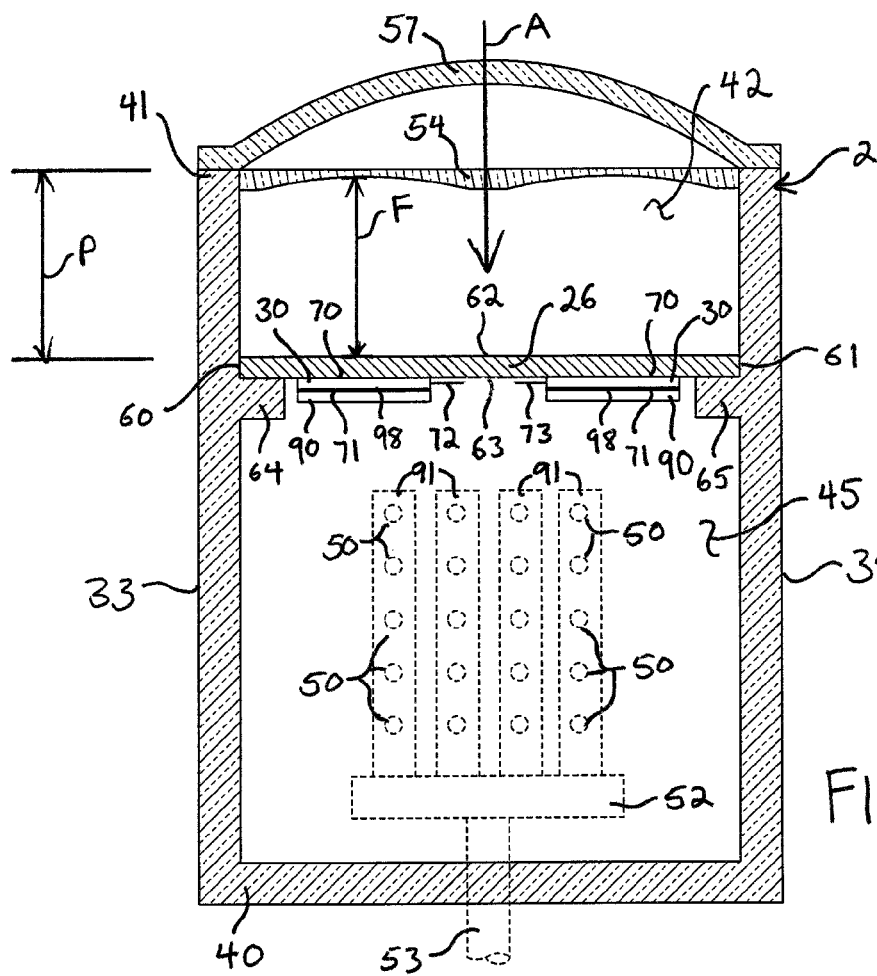
FIG. 5 is a section view taken along the line 5-5 of FIG. 3 illustrating the housing, the thermoelectric devices, and the manifold.

With reference now to FIG. 3 and FIG. 5, a lens 54 is mounted at top 41 of housing and extends across top 41 of housing from end 32 to inner wall 43 between sides 33 and 34 to allow light to pass into thermal compartment 45 and onto plate 26 in a direction generally indicated by arrowed line A in FIG. 5. Lens 54 focuses light at a short focal length F, such as approximately 2 inches, and is preferably a Fresnel lens, although any lens capable of focusing light at a short distance is suitable. In the embodiment shown in FIG. 3, lens 54 is a compound lens with each element of lens 54 having its own independent axis oriented downwardly from directly above each thermoelectric device 30. Arranged in this way, each element of lens 54 focuses light entering housing 21 in a direction generally indicated by arrowed line A in FIG. 3 with respect to a corresponding thermoelectric device 30 located below lens 54.

Shown best in FIG. 1 and FIG. 5, a transparent dome 57 extends over top 41 of housing 21 to allow light to pass through dome 57 in the direction generally indicated by arrowed line A in FIG. 5 and through lens 54 so as to encounter plate 26. Dome 57 is convex and extends from end 31 to end 32 of housing and from side 33 to side 34, fully covering top 41 of housing 21. Dome 57 is a protective dome, and as such has hard, strong, rigid, tough, and rugged material properties, and is constructed out of glass, plastic, or the like.

Light passing through dome 57 is focused by lens 54 onto plate 26. As shown in FIG. 3 and FIG. 5, plate 26 has opposed ends 55 and 56 extending between inner wall 43 and end 32 of housing 21, respectively, and opposed sides 60 and 61 extending between sides 33 and 34, respectively, and an upper surface 62 and an opposed lower surface 63. Plate 26 is mounted to housing 21 between bottom 40 and top 41 of housing 21 at flanges 64 and 65 which extend along sides 33 and 34, respectively from end 32 to inner wall 43 within thermal compartment 45. Ends 60 and 61 of plate 26 are secured to flanges 64 and 65, respectively, with bolts, screws, adhesive, welding, or other suitable method, so as to securely fix plate 26 to housing 21. Plate 26 extends across thermal compartment 45 completely from end 31 to end 32 and from side 33 to side 34 so as to enclose a lower portion of thermal compartment 45 between plate 26 and bottom 40 of housing 21 and isolate the lower portion of thermal compartment 45 from an upper portion between plate 26 and lens 54 at top 41 of housing 21.

Referring now to FIG. 5, plate 26 is located a distance P below lens 54 in thermal compartment 45. Distance P is similar to focal length F of lens 54 so that plate 26 is set below lens 54 such that lens 54 focuses light near upper surface 62 of place 26. Because a Fresnel lens captures a great amount of light and focuses it narrowly over a short focal length, in some embodiments, distance P is slightly different than focal length F so as to ensure that light passing through and focused by lens 54 does not burn or damage plate 26 or housing 21. In other embodiments, distance P varies by moving lens 54 up or down within housing 21 or by moving plate 26 up or down within housing 21, so as to alter distance P with respect to focal length F in response to the amount of light passing through lens 54 and encountering plate 26. In those embodiments, when operation of the invention demands that more light be cast upon plate 26, distance P is altered to be more similar to focal length F, while when operation of the invention allows that less light be cast upon plate 26, distance P is altered to be more different from focal length F.

Plate 26 is a thermal storage unit or thermal mass, is capable of absorbing, storing, and releasing thermal energy to and from the surrounding environment, and is constructed of a material or combination of materials with thermally-conductive properties so that plate 26 readily and evenly transfers thermal energy across plate 26 between upper and lower surfaces 62 and 63 and to articles in thermal communication with plate 26. Plate 26 is preferably constructed of a metal such as aluminum. The material of plate 26 has a relatively high coefficient of thermal conductivity, such as at least 250 Watts per meter-Kelvin, such that plate 26 readily transfers thermal energy to articles in contact with plate 26.

Figure 4:
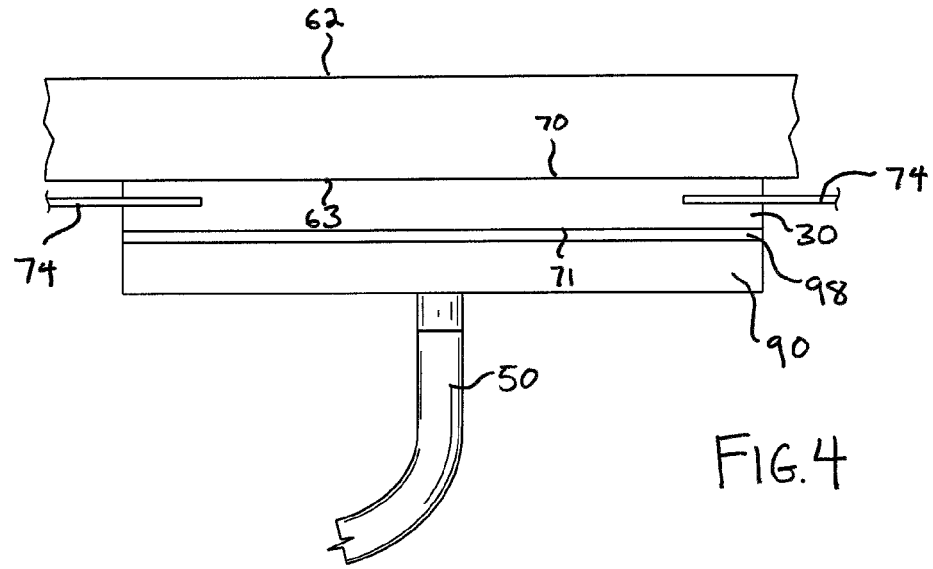
FIG. 4 is an enlarged section view taken along the line 4-4 of FIG. 2 illustrating one of the thermoelectric devices.

Thermoelectric devices 30 are applied to lower surface 63 of plate 26, operatively coupling plate 26 in thermal communication with thermoelectric devices 30 so that thermal energy may transfer between plate 26 and thermoelectric devices 30. As best seen in the embodiment shown in FIG. 2, thermoelectric devices 30 are arranged in two rows extending along the length of thermal compartment 45 within the lower portion of thermal compartment 45 below plate 26, each row comprising ten thermoelectric devices 30. FIG. 4 shows a detailed view of one of the thermoelectric devices 30. Each thermoelectric device 30 has an upper surface 70 and an opposed lower surface 71. Upper surface 70 is mounted to lower surface 63 of plate 26 and is secured against plate 26 with a thermal adhesive or other means of attachment which resists degradation despite temperature fluctuation and allows thermal energy to transfer between plate 26 and upper surface 70 of thermoelectric device, securely coupling thermoelectric device 30 to plate 26 in thermal communication.

As is well-known in the art, thermoelectric devices 30 produce a voltage in response to a temperature difference between a temperature T1 of upper surface 70 and a temperature T2 of lower surface 71. As seen in FIG. 2, the two rows of thermoelectric devices 30 are arranged in two circuits 72 and 73 of ten thermoelectric devices 30 each. Each thermoelectric device 30 within a circuit is electrically coupled by a wire 74 extending from the first lead of one thermoelectric device 30 to the second lead of another thermoelectric device 30, so that the voltage created by each thermoelectric device 30 within one of the circuits 72 and 73 directly adds to the voltage of the one of the circuits 72 and 73. Circuit 72 has two opposed ends 72a and 72b which extend into control compartment 44 and come together at an electrical coupling 72c proximate to top 40 of housing 21 for connecting thermoelectric power generation apparatus 20 to an inverter (not shown) to condition the electricity generated by thermoelectric devices 30 in circuit 72 for connection with an electrical grid. Likewise, circuit 73 has two opposed ends 73a and 73b which extend into control compartment 44 and come together at an electrical coupling 73c proximate to top 40 of housing 21 for connecting thermoelectric power generation apparatus 20 to the inverter to condition the electricity generated by thermoelectric devices 30 in circuit 73 for connection with an electrical grid. Thermoelectric devices 30 produce direct-current ("DC") electricity, and to connect thermoelectric power generation apparatus 20 to most electrical grids, the electricity is first converted to alternating-current ("AC") electricity by the inverter. Electrical couplings 72c and 73c are connectors or outlets at which inverter is coupled to thermoelectric power generation apparatus 20 to transmit electricity to the inverter. Preferably, both electrical couplings 72c and 73c are simultaneously coupled to the inverter so that inverter can draw power from either or both of circuits 72 and 73. Thermoelectric devices 30 in both circuits 72 and 73 will constantly produce electricity throughout, but in some situations the voltage produced by both circuits 72 and 73 will be too high for the inverter, a logic controller on board thermoelectric power generation apparatus 20 will selectively couple one of circuits 72 and 73 to inverter and decouple the other of the circuits 72 and 73 so that inverter draws and converts electricity from only the one of circuits 72 and 73. In other situations in which the voltage produced by both circuits 72 and 73 is not too great for the inverter, the inverter will draw and convert from both circuits 72 and 73, electronically coupling circuits 73 and 73 in parallel at the inverter. In a parallel configuration in which both circuits 72 and 73 are coupled to the inverter, thermoelectric power generation apparatus 20 produces a DC maximum voltage of 480 volts at 13 amps, for a power generation of 6.24 kilowatts, which maximum DC generation of 480 volts is inputted to the inverter and converted into an AC output of 120 volts at 60 hertz. As one having skill in the art will appreciate, these figures for voltage, current, and power are reflective of the particular choices made in the selection of thermoelectric devices 20 made by a certain manufacturer, and the selection of thermoelectric devices 30 made by another manufacturer will cause these figure to deviate slightly by up to twenty percent.

In operation, thermoelectric devices 30 produce electricity when there is a temperature difference between temperature T1 of upper surface 70 and temperature T2 of lower surface 71. Voltage production is proportional to the temperature difference, and thermoelectric devices 30 operate to generate power in response to temperature differences as small as 0.1 degrees Celsius and as large as 65 degrees Celsius, provided the temperature of upper and lower surfaces 70 and 71 does not exceed 125 degrees Celsius. Thermoelectric power generation apparatus 20 preferably operates to produce power when the temperature difference between upper and lower surfaces 70 and 71 is within a preferred range of 6.2 degrees Celsius to 29.2 degrees Celsius, at which temperature differences thermoelectric power generation apparatus 20 generates between 225 volts and 700 volts, respectively. Each thermoelectric device 30 has a first lead and a second lead extending from the thermoelectric device 30 to connect to an electrical circuit. The voltage produced by each thermoelectric device is produced across the first and second leads. Thermoelectric power generation apparatus 20 is installed within ground 28 so as to position top 41 of housing 21 at ground level 27 so that top 41 is exposed, and burying a majority of housing 21 and the entireties of heat sinks 22, 23, 24, and 25 within ground 28. Light and heat entering housing 21 through top 41 and encountering plate 26 transfer thermal energy to plate 26, which is stored as thermal energy setting a temperature T3 of plate 26. Temperature T3 varies with time as differing amounts of light and heat transfer differing amounts of thermal energy to plate 26. Plate 26, having a high coefficient of thermal conductivity, transfers thermal energy stored in plate 26 between upper surfaces 70 of thermoelectric devices 30 which are secured to lower surface 63 of plate 26, and plate 26 thereby provides heat to upper surfaces 70, setting temperature T1 of upper surfaces 70. Because heat transfers readily between lower surface 63 of plate 26 and upper surfaces 70 of thermoelectric devices 30, temperatures T3 and T1 are close or nearly identical. Temperature T1 varies in response to fluctuations in temperature T3 as varying amounts of heat and light encountering plate 26 affect T3. Temperature T1 is thus set passively because it is set or established in response to alterations in T3, which changes with uncontrolled environmental factors such as heat and sunlight. For instance, when an increased amount of light encounters plate 26, temperature T3 of plate 26 will rise, more thermal energy will transfer from lower surface 63 of plate 26 to upper surfaces 70 of thermoelectric devices 30, and temperature T1 of upper surfaces 70 of thermoelectric devices 30 will correspondingly rise and more power is generated. Conversely, when a decreased amount of light encounters plate 26, temperature T3 of plate 26 will fall, less thermal energy will transfer from lower surface 63 of plate 26 to upper surfaces 70 of thermoelectric devices 30, and temperature T1 of upper surfaces 70 of thermoelectric devices 30 will correspondingly fall, and less power is produced.

As stated above, thermoelectric devices 30 preferably operate to generate electricity in response to a difference in temperature between temperature T1 of upper surfaces 70 and temperature T2 of lower surfaces 71 that is within the preferred range. While temperature T1 is passively set by the transfer of thermal energy across the interaction between plate 26 and upper surfaces 70 of thermoelectric devices 30, temperature T2 is set by the transfer of thermal energy between lower surface 71 of thermoelectric devices 30 and heat sinks 22, 23, 24, and 25. Controller 51 in control compartment 45 controls the transfer of thermal energy between lower surfaces 71 and heat sinks 22, 23, 24, and 25 so as to set temperature T2 of lower surface 71 of thermoelectric devices 30 to be different from temperature T1.

Figure 6:
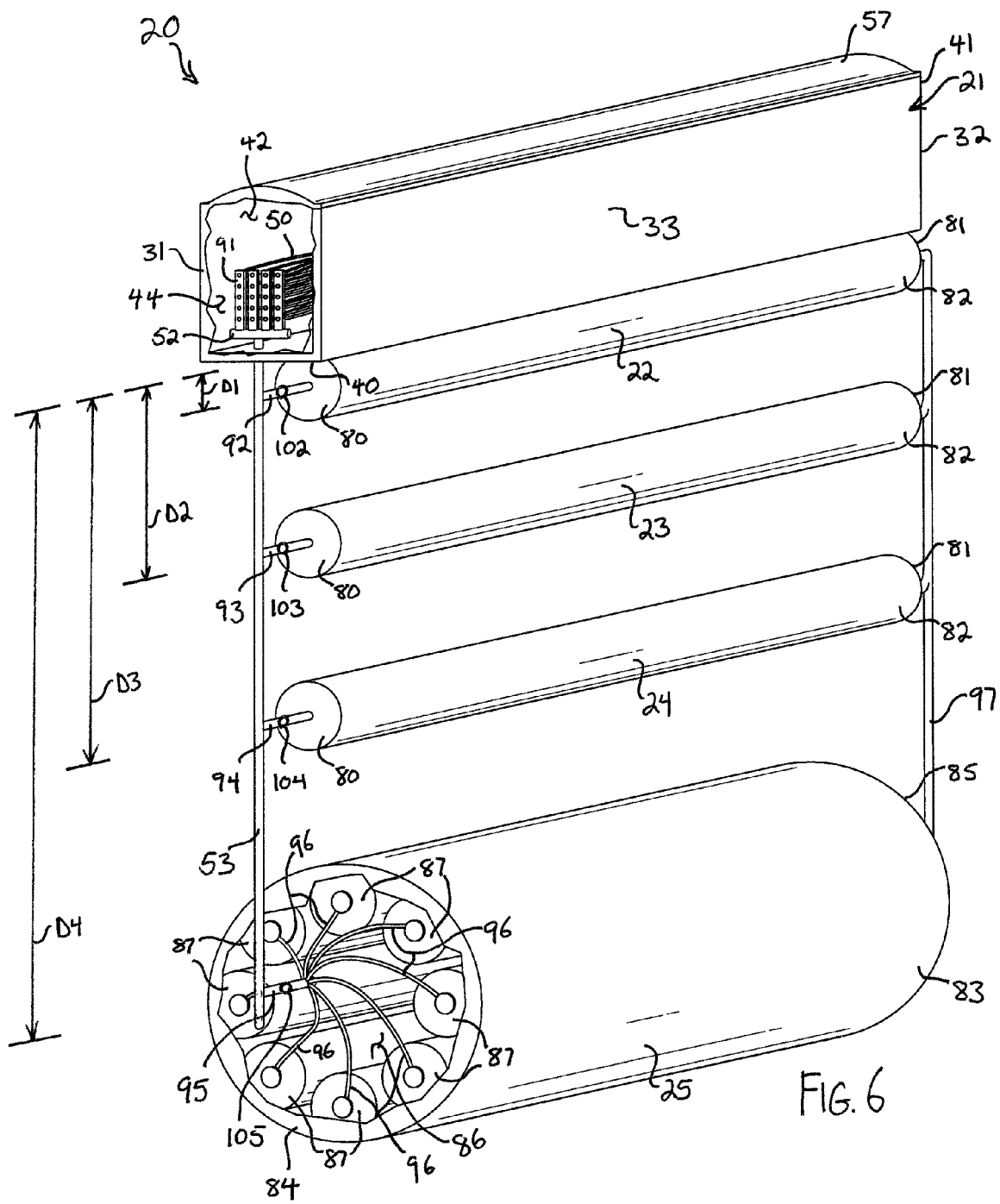
FIG. 6 is a perspective view of the thermoelectric power generation apparatus of FIG. 1 with portions of the housing and one of the heat sinks removed illustrating the interiors of the housing and the one of the heat sinks.

With momentary reference to FIG. 1, heat sinks 22, 23, 24, and 25 are located apart from thermoelectric devices 30 outside of housing 21 and are buried or installed within ground 28 at different depths. Heat sinks 22, 23, 24, and 25 are thermal energy storage units or thermal masses which absorb, store, and release thermal energy to and from the surrounding environment or ground 28. Ground 28 typically has a low coefficient of thermal conductivity, such as 5 Watts per meter-Kelvin or less, while those of heat sinks 22, 23, 24, and 25 are much higher. Heat sinks 22, 23, and 24 are minor heat sinks, while heat sink 25 is a major heat sink. As can be seen in FIG. 6, heat sinks 22, 23, and 24 are identical in every respect, other than location and as described herein. Accordingly, only heat sink 22 will be described in detail, with the understanding that the ensuing discussion of heat sink 22 applies equally to heat sinks 23 and 24. Heat sink 22 is an elongate cylinder extending between opposed ends 80 and 81 and having a cylindrical sidewall 82. Heat sink 22 has a surface area comprised of sidewall 82 and the faces of each of ends 80 and 81, which surface area is exposed to ground 28. Heat sink 22 is preferably a solid body and is constructed of a material, such as copper, or a combination of materials, with thermal-conductive properties so that heat sink 22 readily and evenly transfers thermal energy through heat sink 22. The material of heat sink 22 has a relatively high coefficient of thermal conductivity, such as at least 100 Watts per meter-Kelvin, so that heat sink 22 transfers thermal energy from sidewall 82 through the solid body of heat sink 22 from end 80 to end 81.

As previously mentioned, heat sink 22 is identical in every respect to heat sinks 23 and 24, and throughout the figures, reference characters used to describe the various structural features thereof are applied to heat sinks 22, 23, and 24 for reference purposes. In common with heat sink 22, each of heat sinks 23 and 24 have an end 80, end 81, sidewall 82, and a coefficient of thermal conductivity of at least 100 Watts per meter-Kelvin. As shown in FIG. 6, heat sink 22 is buried a distance D1 below housing 21, heat sink 23 is buried a distance D2 below housing 21, heat sink 24 is buried a distance D3 below housing 21, and distance D3 is greater than distance D2 which is greater than distance D1.

In the embodiments shown throughout the figures, the invention includes four heat sinks 22, 23, 24, and 25. However, it will be understood that embodiments with a greater or lesser number of heat sinks 22, 23, 24, and 25 would be suitable for thermoelectric power generation as well. Moreover, as noted above, heat sinks 22, 23, 24, and 25 are thermal masses, and as such, in some embodiments are sources of heat and cold, such as the bottom of a hot iron, a heat pad, a bucket of ice, a stream of cool air flowing through an air conditioning duct, or a like mass having a thermal energy, which sources of energy are coupled in thermal communication with the upper and lower surfaces 70 and 71 of thermoelectric devices 30.

With continuing reference to FIG. 6, heat sink 25 is similar to heat sinks 22, 23, and 24, but is not identical. Heat sink 25 has a tubular sidewall 83 that extends from an end 84 to an opposed end 85. Sidewall 83 cooperates with ends 84 and 85 to bound and enclose an interior volume 86. In the embodiment shown in FIG. 6, sidewall 83 is constructed of a thermally-non-conductive material. Heat sink 25 is a thermal mass and carries a substrate or array of thermal elements within interior volume 86 to absorb, store, and release thermal energy to and from the surrounding environment or ground 28. Heat sink 25 is a major heat sink, is much larger than heat sinks 22, 23, and 24, and is therefore capable of absorbing, storing, and releasing much more thermal energy than any one of heat sinks 22, 23, and 24. Heat sink 25 is buried a distance D4 below housing 21 which is greater than distance D3 at which heat sink 24 is buried. In a specific embodiment, for example, D1 is approximately 2 inch, D2 is approximately 11 inches, D3 is approximately 21 inches, and D4 is approximately 37 inches, and heat sinks 22, 23, 24, and 25 have diameters of 4 inches, 4 inches, 4 inches, and 16 inches, respectively.

A plurality of elongate thermal elements 87 are contained within interior volume 86 in contact with sidewall 83. Thermal elements 87 are cylindrical and extend from end 84 to end 85 of heat sink 25. Thermal elements 87 are each preferably a solid body constructed of a material, such as iron, or combination of materials, with thermally-conductive properties such that thermal energy readily transfers within and along thermal elements 87 and with a relatively high coefficient of thermal conductivity, such as at least 80 Watts per meter-Kelvin, so that each thermal element 87 is capable of transferring thermal energy through the solid body of thermal element 87.

In other embodiments, interior volume 86 is filled with iron shot. Iron shot applied to interior volume 86 provides a dense substrate through which thermal energy readily conducts, iron having a coefficient of thermal conductivity of around 80 Watts per meter-Kelvin. In other embodiments of the invention, as will be described later, the substrate contained within interior volume 86 is a molten salt such as sodium acetate or sodium sulfate with a high heat storage capacity. Thermal energy stored in the substrate causes the salt to change between solid, liquid, and gas phases, and instead of releasing heat in the phase change, the severance and creation of intermolecular forces in the substrate releases or absorbs heat, such that thermal energy is regulated by controlling the severance and creation of those intermolecular forces.

As shown in FIG. 6 and in FIG. 3, each of heat sinks 22, 23, 24, and 25 are connected with thermoelectric devices 30 by transmission means including conduit 53 extending from heat sinks 22, 23, 24, and 25 to manifold 52 in control compartment 44 of housing 21, and wires 50 leading from manifold 52 in thermal compartment 45 to plates 90 coupled to each thermoelectric device 30. In the embodiments described herein, these transmission means include solid-state materials, but it should be understood that other embodiments include transmission means such as hydraulic fluids, heated and cooled gases, and the like which are capable of transferring thermal energy.

With reference now to the enlarged view of FIG. 4, plate 90 is a thin plate attached to lower surfaces 71 of thermoelectric devices 30. Corresponding to each of the twenty thermoelectric devices 30, plates 90 are affixed to thermoelectric devices 30 with a thermal adhesive 98 or other means of attachment which resists degradation despite temperature fluctuation and allows thermal energy to transfer between plates 90 and lower surfaces 71 of thermoelectric devices 30, securely coupling each plate 90 to thermoelectric device 30 above plate 90 in thermal communication. Each plate 90 is constructed of a thermally-conductive material, such as copper, or a combination of materials, with a relatively high coefficient of thermal conductivity such as 100 Watts per meter-Kelvin so that each plate 90 readily transfers thermal energy between lower surface 71 of thermoelectric device and wire 50.

Wires 50 are thermal leads extending from thermoelectric devices 30 to manifold 52 (shown in FIG. 3) and are thin, thermally-conductive connections coupling plates 90 applied to lower surfaces 71 of thermoelectric devices 30 to manifold 52 in thermal communication so that thermal energy can transfer between lower surfaces 71 of thermoelectric devices 30 and manifold 52. As seen in FIG. 4, wire 50 is applied directly in contact with plate 90 so as to provide thermal energy from plate 90 to wire 50 and to provide thermal energy to plate 90 from wire 50. Wire 50 is fixed to plate 90 by welding, thermal adhesive, or other suitable method of attachment which resists structural degradation despite temperature fluctuation and allows heat transfer flow. With reference now to FIG. 3, wires 50 extend from plate 90 on thermoelectric devices 30 in thermal compartment 45, through inner wall 43 and into control compartment 41, where each wire 50 terminates in manifold 52.

Manifold 52 is constructed of a thermally-conductive material or combination of materials and is a junction of four branches 91, each of which accommodates five wires 50, as shown in FIG. 5. FIG. 5 illustrates wires at branches 91 and not extending through housing 21 for purposes of clarity in the illustration. Wires 50 are fixed to manifold 52 by welding, thermal adhesive, or other suitable method of attachment which resists structural degradation despite temperature fluctuation and allows heat transfer flow. In this manner, thermoelectric devices 30 are coupled in thermal communication to manifold 52 to allow thermal energy to pass between thermoelectric devices 30 and conduit 53. As shown in FIG. 3, conduit 53 extends between each of heat sinks 22, 23, 24, and 25 and manifold 52 coupling heat sinks 22, 23, 24, and 25 and manifold 52 in thermal communication so that thermal energy can flow between heat sinks 22, 23, 24, and 25 and thermoelectric devices 30. Conduit 53 extends downwardly from manifold 52 through bottom 40 of housing 21 and is constructed of a thermally-conductive material, such as copper, or combination of materials, with a relatively high coefficient of thermal conductivity such as 100 Watts per meter-Kelvin making the material suitable to allow the flow of thermal energy through conduit 53 in a fluid-like manner as thermal energy typically flows from regions of high thermal density to regions of low thermal density.

With reference now to FIG. 6, proximate to each heat sink 22, 23, 24, and 25, conduit 53 is formed with a branch 92, 93, 94, and 95 extending between conduit 53 and heat sinks 22, 23, 24, and 25, respectively. Branches 92, 93, 94, and 95 are considered an extension of conduit 53 and thermally couple heat sinks 22, 23, 24, and 25, respectively, with conduit 53. Each branch 92, 93, 94, and 95 is formed with an inline switch 102, 103, 104, and 105, respectively, which moves between an open position and a closed position. Branches 92, 93, 94, and 95 are identical except as described herein. Accordingly, only branch 92, and the constituent elements of branch 92, will be described with respect to heat sink 22, with the understanding that the ensuing discussion applies equally to branches 93, 94, and 95 with respect to heat sinks 23, 24, and 25, respectively.

Branch 92 is thermally coupled directly to both conduit 53 and to end 80 of heat sink 22 with physical connections, such as by welding, thermal adhesive, or other secure attachment that resists degradation despite fluctuations in temperature. The physical connection between branch 92 and end 80 allows thermal energy to selectively transfer between heat sink 22 and branch 92. Switch 102 formed in branch 92 divides branch 92 between a first portion 92a extending between switch 92 and conduit 53 and a second portion 92b extending between switch 92 and heat sink 22, as shown schematically in FIG. 7a and FIG. 7b. Switch 102 moves between selected open and closed positions. In both the open and closed positions of switch 102, switch 102 forms a physical connection between portions 92a and 92b of branch 92, securing heat sink 22 to conduit 53. In the selected closed position of switch 102, heat sink 22 is coupled in thermal communication with conduit 53 which is thermally coupled to thermoelectric devices 30, allowing thermal energy transfer between heat sink 22 and thermoelectric devices 30. In the closed position of switch 102, as shown in FIG. 7a, the physical connection that branch 92 forms between heat sink 22 and conduit 53 is maintained, and switch 102 forms a conducting path extending between 92a and 92b thermal energy transfers in either direction along double-arrowed line A shown in FIG. 7a. In the selected open position of switch 102, despite the persistence of a physical connection between first and second portions 92a and 92b, heat sink 22 is decoupled from thermal communication with conduit 52 which is thermally coupled to thermoelectric devices 30, preventing thermal energy transfer between heat sink 22 and thermoelectric devices 30. In the open position of switch 102, as shown in FIG. 7b, the physical connection that branch 92 forms between heat sink 22 and conduit 53 is altered, the conducting path extending between 92a and 92b is severed, and first and second portions 92a and 92b of branch 92 are physically but not thermally connected, preventing thermal energy from transferring between heat sink 22 and conduit 53.

Switch 102 is a remote-controlled single- or double-throw switch with low-gauge wiring and a high thermal capacity which is capable of passing heat through the low-gauge wiring. Switch 102 is moved between the open and closed position in response to a control signal from controller 51 in control compartment 44. Controller 51 in control compartment 45 sends a control signal to switch 102 in response to different temperatures that are measured and compared, as will be explained momentarily.

With reference back to FIG. 6, branch 95 is substantially identical to branch 92. Branch 95 has first and second portions (not referenced) divided by switch 105 which are selectively coupled and decoupled in thermal communication in response to movement of switch 105 between closed and open positions, respectively. Switch 105 operates identically to switch 102, and the discussion of the operation of switch 102 applies equally to switch 105. However, unlike second portion 92b of branch 92 which terminates at end 80 of heat sink 22, second portion of branch 95 extends through end 84 into interior volume 86 of heat sink 25. A plurality of leads 96, constructed of a thermally-conductive material, depend from second portion of branch 95 within interior volume 86 to each thermal element 87, thermally connecting each thermal element 87 with branch 95 so that heat sink 25 is coupled in thermal communication with conduit 53 and, via conduit 53, manifold 52, and wires 50, is coupled in thermal communication with thermoelectric devices 30.

Heat sinks 22, 23, 24, and 25 are also coupled directly to each other, as shown in FIG. 3 and FIG. 6, by second conduit 97 which extends from end 81 of heat sink 22 to end 81 of heat sink 23, to end 81 of heat sink 24, and to end 85 of heat sink 25. Second conduit 97, like conduit 53, is constructed of a thermally-conductive material, or combination of materials, which is suitable to allow the flow of thermal energy through second conduit 97 in a fluid-like manner as thermal energy typically flows from regions of high thermal density to regions of low thermal density.

As discussed above, thermoelectric devices 30 preferably produce a voltage in response to a preferred range of temperature difference between temperature T1 of upper surfaces 70 of thermoelectric devices 30 and temperature T2 of lower surfaces 71 of thermoelectric devices 30, and voltage is produced only when there is a temperature difference. For example, a difference in temperature across the upper and lower surfaces 70 and 71 of 0.4 degrees Celsius yields a voltage generation of 2.1 volts, a difference of 5.2 degrees Celsius yields a voltage generation of 2.9 volts, a difference of 13.4 degrees Celsius yields a voltage generation of 20.7 volts, and a difference of 24.5 degrees Celsius yields a voltage generation of 24.5 volts per thermoelectric device 30. While temperature T1 is continually passively set by the transfer of thermal energy across the interaction between plate 26 and upper surface 70 of thermoelectric devices 30 causing temperature T1 to move toward temperature T3 of plate 26, as demonstrated by $$\lim_{t \to \infty} T1(t) = T_{plate},$$

(where T2(t) represents temperature T2 as a function of time and $T_{plate}$ is a steady-state temperature of plate 26) temperature T2 is set by the controlled transfer of thermal energy between lower surfaces 71 of thermoelectric devices 30 and heat sinks 22, 23, 24, and 25. Controller 51 controls the transfer of thermal energy between lower surfaces 71 of thermoelectric device 30s and heat sinks 22, 23, 24, and 25 so as to set temperature T2 of lower surface 71 of thermoelectric devices 30 to be different from temperature T1. Controller 51 sets temperature T2 by selectively coupling and decoupling each of heat sinks 22, 23, 24, and 25 in response to temperature T1, temperature T2, and temperatures sensed at each of heat sinks 22, 23, 24, and 25.

Thermal sensors are arranged throughout thermoelectric power generation apparatus 20. Thermal sensors are affixed to plate 26, upper and lower surfaces 70 and 71 of thermoelectric devices 30, and at each of heat sinks 22, 23, 24, and 25 buried at depths D1, D2, D3, and D4, respectively. These thermal sensors measure the temperature at each respective location and are coupled in communication with controller 51, either by wires or wirelessly, to send temperature data gathered from each respective to controller 51.

Temperature T1 of upper surfaces 70 of thermoelectric devices 30 is passively set by the amount of incident light and the amount of ambient heat transferring thermal energy through plate 26 to upper surfaces 70 of thermoelectric devices 30. Temperature T1 is sensed by a sensor located at upper surfaces 70 and is transmitted to controller 51. Controller 51 is a computer preprogrammed with the operating parameters of thermoelectric devices 30, which control parameters include a preferred operative temperature differential ΔT between the temperatures of upper and lower surfaces 70 and 71 within the preferred range at which thermoelectric devices 30 preferably produce electricity. With this known temperature differential ΔT, and with temperature T1 passively set by the provision of thermal energy from plate 26, controller 51 determines an operative selected temperature $T_S$ from the equation $\Delta T = |T1 - T_S|$. Having calculated a value for selected temperature $T_S$, controller then performs a thermal systems analysis and sends control signals to switches 102, 103, 104, and 105 to activate and selectively open and close each of switches 102, 103, 104, and 105 formed in branches 92, 93, 94, and 95, coupling heat sinks 82, 83, 84, and 85, respectively, in thermal communication with lower surfaces 71 of thermoelectric devices 30 to exchange thermal energy between heat sinks 82, 83, 84, and 85 and lower surfaces 71 of thermoelectric devices 30 so that temperature T2 is set to $T_S$.

Controller 51 selectively opens and closes switches 102, 103, 104, and 105 in response to temperatures detected at thermal sensors located at heat sinks 22, 23, 24, and 25, respectively. Because heat sinks 22, 23, 24, and 25 are buried at different depths and in corresponding different temperatures within ground 28, and depending on the location of thermoelectric power generation apparatus 20, the climate, the weather, the amount of sunlight, the composition of ground 28, and a number of other factors, each heat sink 22, 23, 24, and 25 absorbs and stores a different amount of thermal energy and is thus set at a different temperature. The temperature sensed at each of heat sinks 22, 23, 24, and 25 by the local thermal sensor is transmitted to controller 51. Controller 51 is pre-programmed with data for the amount of thermal energy lost to branches 92, 93, 94, and 95, conduit 53, manifold 52, and wires 50, and to the environment surrounding branches 92, 93, 94, and 95 and conduit 52, during transmission of thermal energy, and together with this information, calculates which of switches 102, 103, 104, and 105 should be opened and which should be closed.

Controller 51 instructs switches 102, 103, 104, and 105 to move into open and closed positions in response temperatures sensed throughout thermoelectric power generation apparatus 20. Controller 51 allows thermal energy to transfer between heat sink 22, for example, and lower surfaces 71 or thermoelectric devices 30 by sending a signal to instruct switch 102 to move into the closed position. In the closed position of switch 102, a thermal conduction path is formed across branch 92, and heat flows from heat sink 22 into branch 92 and to conduit 53. Heat then flows up conduit 53 to manifold 52, from which it flows into wires 50. Wires 50 are coupled in thermal communication with plates 90 affixed to lower surfaces 71 of thermoelectric devices 30, and heat in wires 50 transfers through plates 90 and into lower surfaces 71. Likewise, as one having skill in the art will readily appreciate, heat flows in the opposite direction from lower surfaces 71 of thermoelectric devices 30 to heat sink 22 when switch 102 is in the closed position. Controller 51 prevents the flow of heat between heat sink 22 and lower surfaces 71 of thermoelectric devices 30 by sending a signal to instruct switch 102 to move into the open position. By opening or closing switch 102 in this way, controller 51 manipulates the amount of thermal energy in lower surfaces 71 of thermoelectric devices 30 and thus controls the setting of temperature T2. In a similar manner, controller 51 manipulates switches 103, 104, and 105 together with switch 102 to precisely control the amount of thermal energy in lower surfaces 71 of thermoelectric devices 30.

For instance, if moving switch 102 into the closed position and allowing thermal energy to transfer between heat sink 22 and lower surfaces 71 of thermoelectric devices 30, while moving switches 103, 104, and 105 into open positions, sets temperature T2 to selected temperature $T_S$, controller 51 will select such an arrangement by sending a control signal to switch 102 to move into the closed position and by sending control signals to each of switches 103, 104, and 105 to move into the open positions. Alternatively, if moving switch 103 and 105 into the closed positions and allowing thermal energy to transfer between heat sink 23 and lower surfaces 71 of thermoelectric devices 30 as well as between heat sink 25 and lower surfaces 71 of thermoelectric devices 30, while moving switches 102 and 104 into the open positions, would set temperature T2 to selected temperature $T_S$, controller 51 will select that arrangement and send control signals to switches 103 and 105 to move into the closed positions and will send control signals to switches 102 and 104 to move into the open positions.

In another example, if opening switches 102, 103, and 104 so as to decouple heat sinks 22, 23, and 24 altogether from thermal communication with lower surfaces 71 of thermoelectric devices 30 and cyclically opening and closing switch 105 to cyclically couple and decouple heat sink 25 and lower surfaces 71 of thermoelectric devices 30 in thermal communication between would set temperature T2 to selected temperature $T_S$, controller 51 will select that arrangement and send a control signal to switches 102, 103, and 104 to move into the closed positions and will repetitively send control signals to cyclically move switch 105 between the open and closed positions. Switches 102, 103, 104, and 105 can be arranged in a variety of open and closed configurations based on control signals sent by controller 51 in response to the systems calculations that controller 51 performs with temperature data collected from thermal sensors on thermoelectric power generation apparatus 20.

In yet another example, under some conditions, it may be advantageous to transfer thermal energy from heat sinks 22, 23, and 24 to heat sink 25. Such situations might arise if heat sinks 22, 23, and 24 had a great deal of stored thermal energy and, consequently, high temperatures, but, because of the high coefficients of thermal conductivity of heat sinks 22, 23, and 24, were transferring heat to the environment quickly, such as might occur during transition from a hot day to a cold night. In such a situation, controller 51 would open switches 102, 103, 104, and 105 to decouple all of the heat sinks from thermoelectric devices 30. In this selected arrangement, because heat flows from areas of high thermal energy density to areas of low thermal energy density, the thermal energy stored in heat sinks 22, 23, and 24 transfers to heat sink 25. Heat sink 25 has a lower coefficient of thermal conductivity than heat sinks 22, 23, and 24, so less heat is lost to the environment by transferring the thermal energy to heat sink 25. Moreover, the low coefficient of thermal conductivity of an environment such as soil contributes to this insulative effect or tendency for heat sink 25 to slowly release heat to the environment. Switch 105 can then close, while switches 102, 103, and 104 remain open, so that heat sink 25 alone is coupled in thermal communication with lower surfaces 71 of thermoelectric devices 30, allowing thermal energy to transfer between heat sink 25 and lower surfaces 71 or thermoelectric devices 30 for a longer period of time than would be possible if the thermal energy had not been first transferred away from heat sinks 22, 23, and 24.

It should be understood that upper surface 70 and lower surface 71 of thermoelectric devices 30 can alternately be either "hot" surfaces or "cold" surfaces. The terms "hot" and "cold" are relative terms; as one having skill in the art will readily appreciate, thermoelectric power generation apparatus 20 generates power when there is merely a temperature difference across the upper and lower surfaces 70 and 71 of thermoelectric devices 30 and does not require that a particular surface be hot while the other be cold. Moreover, one having skill in the art will understand that thermoelectric devices 30 generate a voltage regardless of whether a particular surface is hotter or colder than the other surface as long as there is a temperature differential between the opposed surfaces within the preferred range.

Figure 8:
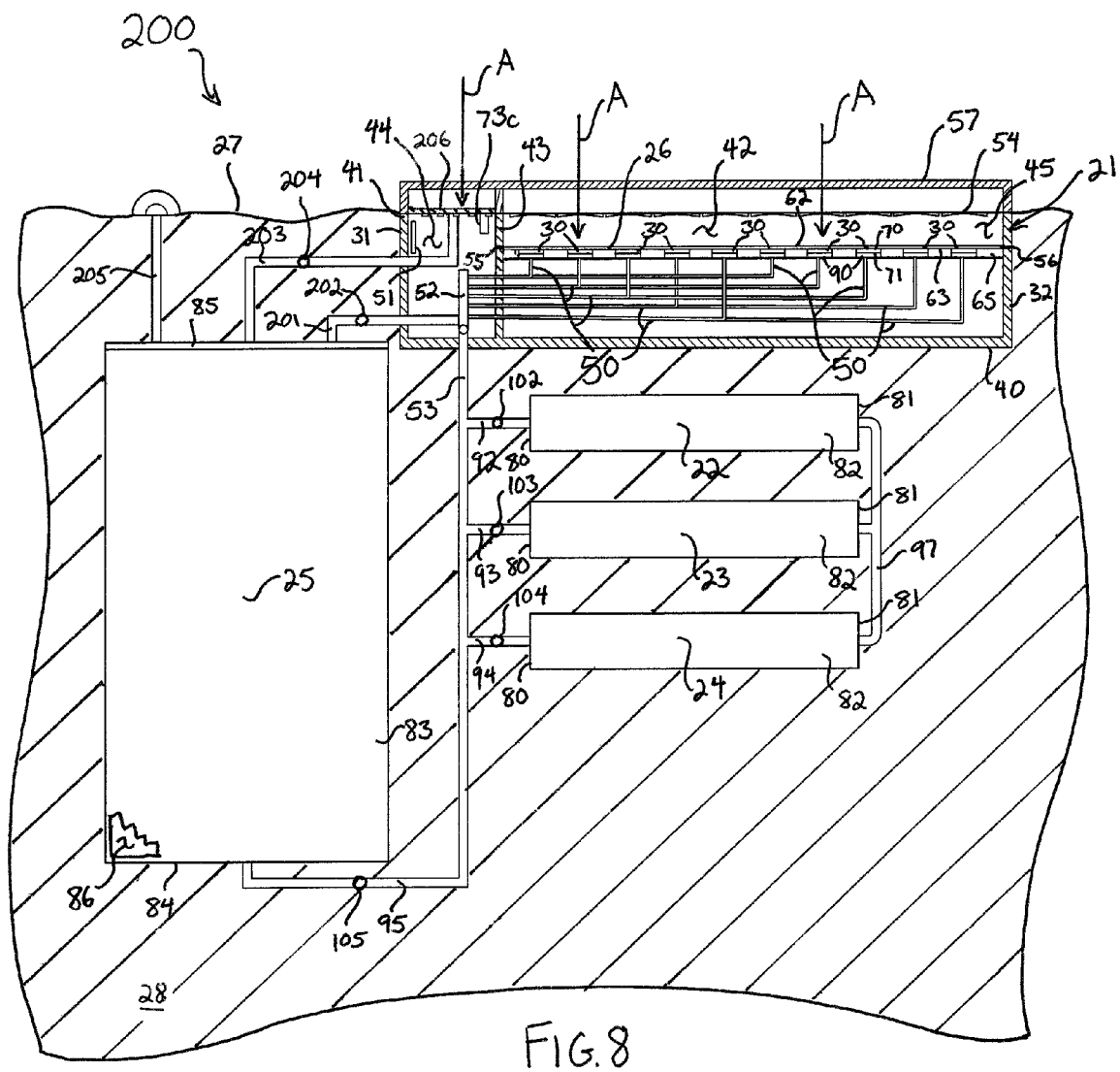
FIG. 8 is a section view of the thermoelectric power generation apparatus of FIG. 1 taken along line 3-3 of FIG. 2, illustrating an alternate embodiment of one of the heat sinks.

Turning finally to FIG. 8, an embodiment of the present invention is shown. Thermoelectric power generation apparatus 200 is identical in every respect to thermoelectric power generation apparatus 20 except as described herein, and in FIG. 8, reference characters used to describe the various common structural features of thermoelectric power generation apparatus 20 are applied to thermoelectric power generation apparatus 200 for reference purposes. For instance, in common with thermoelectric power generation apparatus 20, thermoelectric power generation apparatus 200 includes a housing 21, heat sinks 22, 23, 24, and 25, a plate 26, a plurality of thermoelectric devices 30, wires 50, a controller 51, a manifold 52, a conduit 53, a second conduit 97, branches 92, 93, 94, and 95, and switches 102, 103, 104, and 105. As with thermoelectric power generation apparatus 20, light enters housing 21 in a direction generally indicated by arrowed lines A in FIG. 8 to encounter and transfer thermal energy to plate 26. In this embodiment, however, heat sink 25 is oriented vertically so that it extends from end 84 located below heat sinks 22, 23, and 24 to end 85 located proximate to bottom 40 of housing 21. Moreover, interior volume 86 of heat sink 25 contains iron shot or molten salts as previously described in other embodiments. This vertical orientation creates a heat gradient across heat sink 25 from end 84 to end 85, where end 84 has one temperature and end 85 has another, different temperature. In some embodiments, end 85 is open and exposed to ground 28 below, while in other embodiments, such as that shown in FIG. 8, end 85 is a closed end and constructed of a thermally-conductive material such as copper, or a combination of materials, with thermal-conductive properties and a relatively high coefficient of thermal conductivity, such as at least 100 Watts per meter-Kelvin, so that end 84 will readily transfer thermal energy between heat sink 25 and ground 28.

Heat sink 25 is also thermally coupled to plate 26 by several connections in thermoelectric power generation apparatus 200. As with thermoelectric power generation apparatus 20, conduit 53 extends downwardly from bottom 40 of housing 21, and branch 95 selectively couples heat sink 25 with conduit 53. Heat sink 25 is also directly coupled in thermal communication to manifold 52 by branch a 201. Branch 201 is formed with an inline switch 202 which moves between open and closed positions, in the same manner that switch 102 does, to selectively decouple and couple heat sink 25 from direct thermal communication with manifold 52. Thermoelectric power generation apparatus 200 is formed with a plate 206 extending across control compartment 44 proximate to top 41 of housing 21, and is located just below dome 57 so that light passing through dome 57 in a direction generally indicated by arrowed lines A falls on plate 206 and transfers thermal energy to plate 206. End 85 of heat sink 25 is directly coupled in thermal communication to plate 206 by a branch 203 which is formed with a switch 204. Switch 204 moves between open and closed positions, in the same manner that switch 102 does, to selectively decouple and couple heat sink 25 from direct thermal communication with plate 206. An exhaust vent 205 extends upwardly from heat sink 25. Exhaust vent 205 is coupled to interior volume 86 of heat sink 25 in fluid communication so that hot air within interior volume 86 can be released to the environment.

Because heat sink 25 is a thermal mass that stores thermal energy and contains a substrate such as molten salt, heat sink 25 is capable of storing greater thermal energy than plate 26 and heat sinks 22, 23, and 24. Heat sink 25 is actively fed or loaded with thermal energy by closing switch 204 and opening switch 202, so that heat may flow between end 85 and plate 206 and heat may not flow between end 85 and manifold 52. Plate 206 absorbs thermal energy during the day from sunlight radiating through dome 57 and falling on plate 206. That thermal energy transfers from plate 206 to end 85, adding thermal energy to heat sink 25 and raising the temperature of end 85. Heat sink 25 is thus loaded with stored thermal energy, and switch 204 is then moved to the open position so that thermal energy cannot transfer between end 85 and plate 206. This thermal energy is stored in heat sink 25 until night time when temperatures above ground level 27 fall.

When temperature T1 of upper surfaces 70 of thermoelectric devices 30 is low and there is a large amount of thermal energy in heat sink 25, as might occur during nighttime, controller 51 transmits a signal to open switches 102, 103, 104, and 204, decoupling heat sink 22, 23, and 24 from thermal communication with thermoelectric devices 30 and decoupling end 85 of heat sink 25 from thermal communication with plate 206. Controller 51 transmits a signal to move switch 202 into a closed position, coupling end 85 of heat sink 25 with lower surfaces 71 of thermoelectric devices 30, allowing thermal energy to flow from end 85 of heat sink 25 to lower surfaces 71 so as to raise temperature T2 to near the calculated selected temperature $T_S$ that is different from temperature T1 of upper surfaces 70 by a differential that is within the preferred range of temperature difference so that thermoelectric devices 30 produce electricity.

Having fully described the invention in such clear and concise terms as to enable those skilled in the art to understand and practice the same, the invention claimed is:

The invention claimed is:

1. A thermoelectric power generation apparatus comprising:
    a thermoelectric device having a first surface and an opposed second surface;
    a first thermal energy storage unit having a solid body operatively coupled to the first surface of the thermoelectric device setting the first surface at a first temperature;
    a second thermal energy storage unit having a solid body and a storage unit temperature which is different from the first temperature of the first surface of the thermoelectric device;
    a thermally-conductive conduit extending between the second thermal energy storage unit and the second surface of the thermoelectric device;
    a controller programmed to sense the first temperature of the first surface and the storage unit temperature of the second thermal energy storage unit and instruct the second thermal energy storage unit to move between a coupled arrangement, in which the thermally-conductive conduit couples the second thermal energy storage unit to a second surface of the thermoelectric device and a decoupled arrangement in response to a temperature difference between the first temperature of the first surface and the storage unit temperature of the second thermal energy storage unit, wherein
    the second thermal energy unit sets the second surface of the thermoelectric device at a second temperature in response to a temperature difference between the first temperature and the storage unit temperature wherein the second temperature is different than the first temperature and the operative temperature;
    and the thermoelectric device generates power in response to a temperature differential between the first temperature of the first surface and the temperature of the second surface.

2. A thermoelectric power generation apparatus according to claim 1, wherein:
    the second thermal energy storage unit includes a first thermal mass located apart from the thermoelectric device;
    in the coupled arrangement of the second thermal energy storage unit, the first thermal mass is coupled in thermal communication to the second surface of the thermoelectric device, allowing thermal energy transfer between the first thermal mass and the second surface of the thermoelectric device; and
    in the decoupled arrangement of the second thermal energy storage unit, the first thermal mass is decoupled from thermal communication to the second surface of the thermoelectric device, preventing thermal energy transfer between the first thermal mass and the second surface of the thermoelectric device.

3. A thermoelectric power generation apparatus according to claim 2, wherein:
    the second thermal energy storage unit includes a second thermal mass located apart from the thermoelectric device;
    the second thermal mass is adjustable between a coupled arrangement and a decoupled arrangement;
    in the coupled arrangement of the second thermal mass and in the coupled arrangement of the second thermal energy storage unit, the second thermal mass is coupled in thermal communication to the second surface of the thermoelectric device, allowing thermal energy transfer between the second thermal mass and the second surface of the thermoelectric device; and
    in the decoupled arrangement of the second thermal mass, the second thermal mass is decoupled from thermal communication to the second surface of the thermoelectric device, preventing thermal energy transfer between the second thermal mass and the second surface of the thermoelectric device.

4. A thermoelectric power generation apparatus according to claim 3, wherein:
    the first and second thermal masses have first and second coefficients of thermal conductivity, respectively;
    the first and second thermal masses are located in a ground which has a third coefficient of thermal conductivity; and
    each of the first and second coefficients of thermal conductivity are greater than the third coefficient of thermal conductivity of the ground in which the first and second thermal masses are located.

5. A thermoelectric power generation apparatus according to claim 4, wherein:
    the first thermal mass is installed in the ground at a first depth below the surface of the ground;
    the second thermal mass is installed in the ground at a second depth below the surface of the ground; and
    the first depth is different from the second depth.

6. A thermoelectric power generation apparatus comprising:
    a thermoelectric device having a first surface with a first temperature and an opposed second surface with a second temperature;
    a first thermal energy storage unit coupled to the first surface of the thermoelectric device providing the first temperature of the first surface;

a second thermal energy storage unit having a third temperature;

a thermally-conductive conduit extending between the second thermal energy storage unit and the second surface of the thermoelectric device;

a controller programmed to detect a temperature difference between the first temperature of the first surface and the third temperature of the second thermal energy storage unit;

the second thermal energy storage unit is operatively coupled in thermal communication to the second surface of the thermoelectric device by the thermally-conductive conduit and changes the second temperature of the second surface to an operative temperature in response to the temperature difference detected by the controller wherein the operative temperature is different than the first temperature and the third temperature by coupling and decoupling the thermally-conductive conduit; and the thermoelectric device generates power in response to a temperature differential between the first temperature of the first surface and the operative temperature of the second surface.

7. A thermoelectric power generation apparatus according to claim 6, wherein the second thermal energy storage unit comprises a first thermally-conductive thermal mass having an inert, solid body located apart from the thermoelectric device.

8. A thermoelectric power generation apparatus according to claim 7, wherein:

a first thermally-conductive connection extends between the first thermal mass and the second surface of the thermoelectric device;

a first switch is formed in the first connection between the first thermal mass and the second surface of the thermoelectric device, the first switch moveable between an open position and a closed position;

in the open position of the first switch, the first thermal mass is decoupled from thermal communication to the second surface of the thermoelectric device preventing thermal energy transfer between the first thermal mass and the second surface of the thermoelectric device; and in the closed position of the first switch, the first thermal mass is coupled in thermal communication to the second surface of the thermoelectric device, allowing thermal energy transfer between the first thermal mass and the second surface of the thermoelectric device.

9. A thermoelectric power generation apparatus according to claim 8, further comprising:

a housing bounding an enclosed interior and having a top;

the first thermal energy storage unit comprises a thermally-conductive plate mounted to the housing proximate to the top of the housing, the plate having opposed upper and lower surfaces; and the thermoelectric device is in the interior of the housing, and the first surface of the thermoelectric device is applied against the lower surface of the plate.

10. A thermoelectric power generation apparatus according to claim 9, wherein:

the first thermal mass is located outside of the housing;

the second thermal energy storage unit includes a second thermally-conductive thermal mass located outside of the housing, a second thermally-conductive connection extending between the second thermal mass and the second surface of the thermoelectric device, and a second switch formed in the second connection between the second thermal mass and the second surface of the thermoelectric device;

the second switch is moveable between an open position and a closed position;

in the open position of the second switch, the second thermal mass is decoupled from thermal communication to the second surface of the thermoelectric device preventing thermal energy transfer between the second thermal mass and the second surface of the thermoelectric device; and in the closed position of the second switch, the second thermal mass is coupled in thermal communication to the second surface of the thermoelectric device, allowing thermal energy transfer between the second thermal mass and the second surface of the thermoelectric device.

11. A thermoelectric power generation apparatus according to claim 10, further comprising:

a fourth temperature of the first thermal mass;

a fifth temperature of the second thermal mass; and the controller is programmed to detect the first, second, fourth, and fifth temperatures and move the first and second switches between the open and closed positions in response to differences among the first, second, fourth, and fifth temperatures so as to control thermal energy transfer between the first and second thermal masses and the second surface of the thermoelectric device to change the second temperature at the second surface of the thermoelectric device to the operative temperature.

12. A thermoelectric power generation apparatus according to claim 10, wherein:

the first and second thermal masses have first and second coefficients of thermal conductivity, respectively;

the first and second connections have third and fourth coefficients of thermal conductivity, respectively;

the first and second thermal masses and the first and second connections are located in a ground which has a fifth coefficient of thermal conductivity; and each of the first, second, third, and fourth coefficients of thermal conductivity are greater than the fifth coefficient of thermal conductivity of the ground in which the first and second thermal masses and the first and second connections are located.

13. A thermoelectric power generation apparatus according to claim 10, further comprising:

a lens mounted proximate to the top of the housing;

the lens has a focal length; and the upper surface of the plate mounted to the housing is separated from the lens by a distance corresponding to the focal length of the lens.

14. A thermoelectric power generation apparatus according to claim 10, wherein:

the housing is installed in a ground so as to locate the top of the housing at the surface of the ground;

the first thermal mass is installed at a first depth below the surface of the ground;

the second thermal mass is installed at a second depth below the surface of the ground; and the first depth is different from the second depth.

15. A method for generating power, comprising:

providing a thermoelectric device having a first surface and an opposed second surface, the first surface having a first temperature and the second surface having a second temperature;

providing a first thermal energy storage unit operatively coupled to the first surface of the thermoelectric device;

providing a second thermal energy storage operatively coupled to the second surface of the thermoelectric device with a thermally-conductive conduit extending between the second thermal energy storage unit and the second surface of the thermoelectric device, the second thermal energy storage unit having a third temperature;

providing a controller configured to detect a temperature difference between the first temperature of the first surface and the third temperature of the second thermal energy storage unit;

the controller detecting the temperature difference between the first temperature and the third temperature;

the controller changing the second temperature of the second surface to an operative temperature in response to the controller detecting the temperature difference between the first temperature and the third temperature, wherein the operative temperature is different from the first and second temperatures and forms a temperature differential between the first temperature of the first surface and the operative temperature of the second surface; and the thermoelectric device generating power in response to the temperature differential.

16. A method for generating power according to claim 15, further comprising:

providing a thermally-conductive plate; and thermally coupling the plate to the first surface of the thermoelectric device allowing thermal energy transfer between the plate and the first surface of the thermoelectric device.

17. A method for generating power according to claim 15, wherein the step of changing the second temperature of the second surface to an operative temperature comprises:

providing a first thermal mass having a third temperature different from the first temperature of the first surface of the thermoelectric device and the second temperature of the second surface of the thermoelectric device;

thermally coupling the first thermal mass to the second surface of the thermoelectric device; and transferring thermal energy between the first thermal mass and the second surface of the thermoelectric device.

18. A method for generating power according to claim 17, wherein the step of changing the second temperature of the second surface to an operative temperature further comprises:

providing a second thermal mass having a fourth temperature different from the first temperature of the first surface of the thermoelectric device and the second temperature of the second surface of the thermoelectric device;

thermally coupling the second thermal mass to the second surface of the thermoelectric device; and transferring thermal energy between the second thermal mass and the second surface of the thermoelectric device.

19. A method for generating power according to claim 18, further comprising:

installing the first thermal mass in thermal communication with a ground at a first depth below the ground;

installing the second thermal mass in thermal communication with the ground at a second depth below the ground different from the first depth; and allowing thermal energy to transfer between the first thermal mass and the ground and between the second thermal mass and the ground.

* * * * *